(12) United States Patent
Nomoto

(10) Patent No.: US 7,978,305 B2
(45) Date of Patent: Jul. 12, 2011

(54) EXPOSURE APPARATUS AND DEVICE MANUFACTURING METHOD

(75) Inventor: Makoto Nomoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 481 days.

(21) Appl. No.: 12/134,542

(22) Filed: Jun. 6, 2008

(65) Prior Publication Data

US 2009/0002650 A1 Jan. 1, 2009

(30) Foreign Application Priority Data

Jun. 29, 2007 (JP) ................. 2007-173110

(51) Int. Cl.
*G03B 27/42* (2006.01)
*G03B 27/52* (2006.01)

(52) U.S. Cl. ........................... 355/53; 355/30
(58) Field of Classification Search ............... 355/30, 355/53, 77; 250/548
See application file for complete search history.

(56) References Cited

U.S. PATENT DOCUMENTS

| | | | |
|---|---|---|---|
| 6,987,554 B2 | 1/2006 | Nomoto | 355/53 |
| 7,283,199 B2 | 10/2007 | Aichi et al. | 355/30 |
| 7,317,505 B2 | 1/2008 | Aichi et al. | 355/30 |
| 7,352,437 B2 | 4/2008 | Nomoto | 355/53 |
| 7,697,110 B2 * | 4/2010 | Nagasaka et al. | 355/30 |
| 7,714,980 B2 * | 5/2010 | Sakai | 355/30 |
| 2005/0134817 A1 | 6/2005 | Nakamura | 355/53 |
| 2005/0185155 A1 * | 8/2005 | Kishikawa | 355/30 |
| 2007/0058263 A1 | 3/2007 | Chang et al. | 359/665 |
| 2007/0089853 A1 | 4/2007 | Nomoto | 165/65 |
| 2007/0188725 A1 | 8/2007 | Sakai | 355/53 |
| 2007/0242247 A1 | 10/2007 | Shiraishi | |
| 2007/0291239 A1 | 12/2007 | Shiraishi | |
| 2008/0239260 A1 | 10/2008 | Shiraishi | |

FOREIGN PATENT DOCUMENTS

| | | |
|---|---|---|
| JP | 61-51596 | 3/1986 |
| JP | 5-269305 | 10/1993 |
| JP | 2004-251928 | 9/2004 |
| JP | 2004-282023 | 10/2004 |
| JP | 2005-019615 | 1/2005 |

(Continued)

OTHER PUBLICATIONS

Korean Office Action dated Feb. 17, 2010, issued in corresponding Korean patent application No. 10-2008-0054881.

(Continued)

*Primary Examiner* — Hung Henry Nguyen
(74) *Attorney, Agent, or Firm* — Fitzpatrick, Cella, Harper & Scinto

(57) ABSTRACT

An exposure apparatus which exposes a pattern of an original onto a substrate via a projection optical system in a state in which a gap between the projection optical system and the substrate is filled with a liquid. A liquid supply unit supplies liquid to the gap. A front side degassing unit performs a degassing to the liquid prior to being supplied to the gap. A dissolved gas measurement unit is provided on the downstream side of the front side degassing unit, and a rear side degassing unit is provided on the downstream side of the dissolved gas measuring unit. The front side degassing unit has a dissolved oxygen control unit, which controls a supply amount of nitrogen gas so as to be the amount of dissolved oxygen, measured by the dissolved gas measurement unit, to a predetermined value.

4 Claims, 3 Drawing Sheets

FOREIGN PATENT DOCUMENTS

| | | |
|---|---|---|
| JP | 2005-105290 | 4/2005 |
| JP | 2006-073906 | 3/2006 |
| JP | 2007-019548 | 1/2007 |
| JP | 2007-081373 | 3/2007 |
| JP | 2007-152235 | 6/2007 |
| JP | 2007-157757 | 6/2007 |
| JP | 2008-182167 | 8/2008 |
| KR | 10-2007-0026791 A | 3/2007 |
| WO | WO 2005/122218 A1 | 12/2005 |

OTHER PUBLICATIONS

Japanese Office Action dated Jul. 17, 2009, issued in corresponding Japanese patent application No. 2007-173110.

* cited by examiner

EXPOSURE APPARATUS AND DEVICE MANUFACTURING METHOD

This application claims the benefit of Japanese Patent Application No. 2007-173110, filed Jun. 29, 2007, which is hereby incorporated by reference herein in its entirety.

BACKGROUND OF THE INVENTION

1. Field of the Invention

The present invention relates to a liquid immersion exposure technique, which projects a pattern of an original onto a substrate in a stage in which a gap between the projection optical system and the substrate is filled with a liquid.

2. Description of the Related Art

FIG. 3 shows a general structure of an exposure apparatus.

In FIG. 3, reference numeral 31 denotes a light source. In recent years, the light source 31 has shifted from an I-line to an excimer laser with a trend of shortening the wavelength due to miniaturization of exposure patterns, and even the laser source is shifted from KrF to ArF. Currently, in order to satisfy the demand of further miniaturization, the use of an $F_2$ laser and EUV light are being investigated.

Light from the light source 31 passes through an introduction unit 32 and is led to an illumination optical system 33. At the illumination optical system 33, an illumination uniformity is eliminated and a beam is formed, and then, illumination light is irradiated onto a reticle 34, which is the original of the pattern to be exposed. The reticle 34, acting as an original, is placed on a reticle stage 35.

The light that has passed through the reticle 34 becomes the pattern light and is reduced-projected via a projection optical system 36, onto a wafer 37, as the substrate placed on an optical conjugated plane with the reticle 24.

The reticle 34 and the wafer 37 are each placed on a reticle stage 35 and a wafer stage 38 having a linear motor as a driving source, respectively, and exposure is repeatedly performed by step and repeat.

Further, a liquid immersion exposure apparatus, which has a gap between the projection optical system 36 and the wafer 37, filled with a liquid, such as pure water, has drawn attention in recent years. The liquid immersion method realizes a high-NA (numerical aperture) by the liquid having a high refractive index. This means that further miniaturization can easily be realized by providing an immersion liquid supplying unit to an existing ArF exposure apparatus without using an $F_2$ and an EUV light source, which are burdensome to install.

FIG. 4 shows the structure of an immersion liquid supply system in a liquid immersion exposure apparatus.

In FIG. 4, a liquid immersion region is generated by a liquid immersion wall 21 on the bottom-most surface of the projection optical system 36, and a liquid supplying nozzle 22 and a liquid withdrawing nozzle 23 are placed in the liquid immersion region. Then, by supplying and recovering a predetermined amount of immersion liquid from the liquid supplying nozzle 22 and the liquid recovering nozzle 23, respectively, exposure is performed in a state where the liquid immersion region is filled with the immersion liquid.

The immersion liquid forms a part of the optical components, and thus, strict maintenance of purity, flow rate and temperature is required. Generally, ultra-pure water is used. The ultra-pure water produced in factory equipment is temperature-adjusted by a cooling device 24, a heater 25, a temperature sensor 26 and a temperature adjustment device 27, via a supply line 28, and is supplied to the liquid immersion region via the liquid supplying nozzle 22.

Further, a degassing unit 41 is provided with the supply line 28 and removes gases dissolved in the immersion liquid, thereby to attempt to reduce an exposure defect caused by micro-bubbles and to improve transmittance of the exposure light through the immersion liquid.

The above-mentioned improvement of transmittance not only improves productivity due to shortening of the exposure time, but, also, suppresses changes in the refractive index of the immersion liquid due to a rise in temperature caused by exposure energy. Thereby, good imaging performance can be stably obtained. See, for example, Japanese Patent Application Laid-Open no. 2004-282023 and Japanese Patent Application Laid-Open No. 2005-019615.

FIG. 5 shows the structure of a degassing unit.

In FIG. 5, tube-shaped hollow fiber membranes 42 are bundled together, and a degassing module 43, having a structure in which a space is separated into the membrane wall interior and the membrane wall exterior of the hollow fiber membrane 42, is arranged. An immersion liquid is supplied from a supply port 44 communicated with the membrane wall interior, and vacuuming is performed from an exterior supplying port 45, which is communicated with the membrane wall exterior. With this setup, degassing can be performed by discharging gases dissolved in the immersion liquid to the vacuum side of the membrane wall exterior via the hollow fiber membrane 42. The degassed immersion liquid is discharged from an interior discharge port 46 communicated with the membrane wall interior and returns back to the supply line 28.

However, the above-mentioned degassing unit utilizes a diffusion unit phenomenon of the membrane, which requires a vacuum pressure decrease, a membrane surface area increase, or making the membrane thinner, in order to improve the degassing efficiency.

On the other hand, there is a limit in the degassing capability, due to limitations in pressure resistance and space. When there is a change in the amount of dissolved gas prior to degassing, the change affects the degassed immersion liquid in the downstream side.

Further, the performance of the vacuum pump is closely related to the atmospheric pressure. Thus, a change of the atmospheric pressure may cause changes in degassing capabilities.

Further, oxygen, which is a component of the dissolved gases, is closely related to the transmittance of the immersion liquid, and a change of 0.73%/cm in transmittance occurs by a change in concentration of dissolved oxygen, by 1 ppm.

Thus, changes in the amount of dissolved gases in the liquid immersion exposure apparatus may occur when there is a change in the atmospheric pressure or in the amount of dissolved gases in the immersion liquid supplied from the factory equipment, which may cause an occurrence of micro-bubbles and deterioration of the optical performance.

SUMMARY OF THE INVENTION

The present invention has been made in consideration of the above-described problem, and attains a liquid immersion exposure technique that eliminates affects of the atmospheric pressure and fluctuations in dissolved gas amount from factory equipment, thereby preventing occurrences of micro-bubbles and deterioration of optical performance.

In order to solve the above-described problem, according to the present invention, an exposure apparatus exposes a pattern of an original onto a substrate via projection optical system in a state in which a gap between the projection optical system and the substrate is filled with a liquid. The exposure apparatus comprises a liquid supply unit that supplies liquid to the gap, a front side degassing unit provided so as to perform a degassing operation using nitrogen gas to the liquid prior to being supplied to the gap, a dissolved gas measurement unit provided on a downstream side of the front side of a degassing unit, and a rear side degassing unit provided on a downstream side of the dissolved gas measurement unit, wherein the front side degassing unit has a dissolved oxygen control unit, which controls a supply amount of nitrogen gas so as to be the amount of dissolved oxygen, measured by the dissolved gas measurement unit, at a predetermined value.

Further, the device manufacturing method of the present invention comprises a step of exposing the pattern of the original onto the substrate using the above-mentioned exposure apparatus, and a step of developing the substrate that is exposed.

According to the present invention, fluctuations in the amount of dissolved oxygen can be reduced by suppressing changes in degassing performance caused by changes in temperature, pressure and atmospheric pressure. As a result, changes in optical performance and refractive index of the immersion liquid, which are related to the amount of dissolved oxygen, can be suppressed. Further, an occurrence of micro-bubbles can be suppressed, and optical performance from deterioration can be prevented.

Further features and aspects of the present invention will become apparent from the following description of exemplary embodiments (with reference to the attached drawings).

DESCRIPTION OF THE EMBODIMENTS

With reference to the attached figures, the best mode for carrying out the present invention will be explained in detail below.

The embodiments explained below are only examples for carrying out the present invention, which can be freely altered depending on the apparatus structure, as well as other various parameters to which the present invention is applied, and they do not limit the current invention in any way.

First Embodiment

Figure 1:
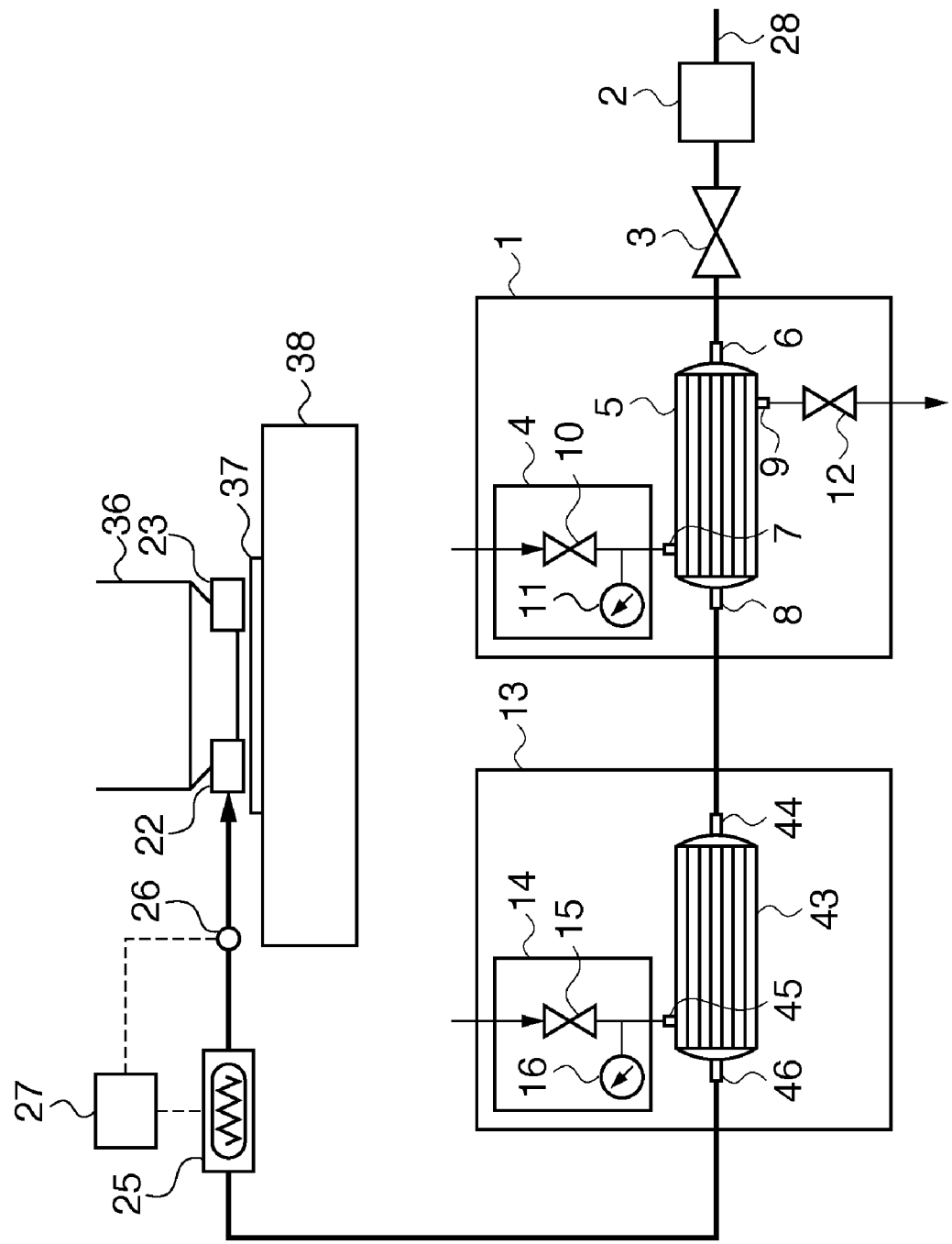
FIG. 1 shows the structure of an immersion liquid supply system of a liquid immersion exposure apparatus in a first embodiment of the present invention.
Figure 4:
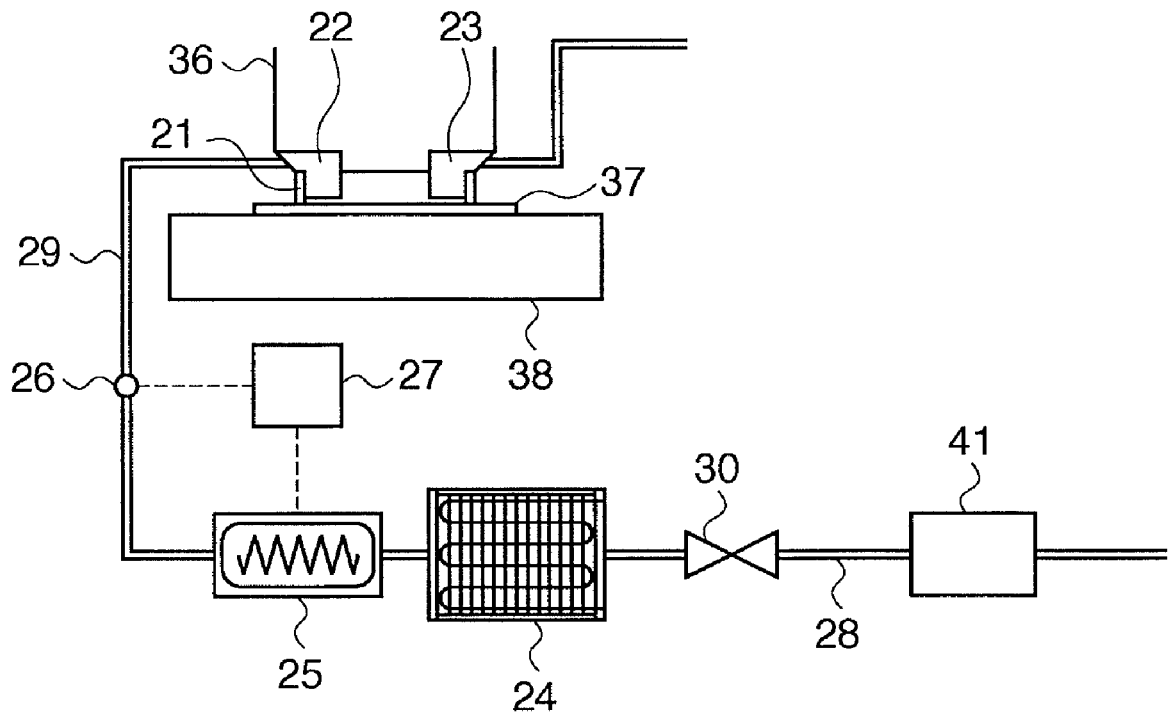
FIG. 4 shows the structure of an immersion liquid supply system of a liquid immersion exposure apparatus.
Figure 5:
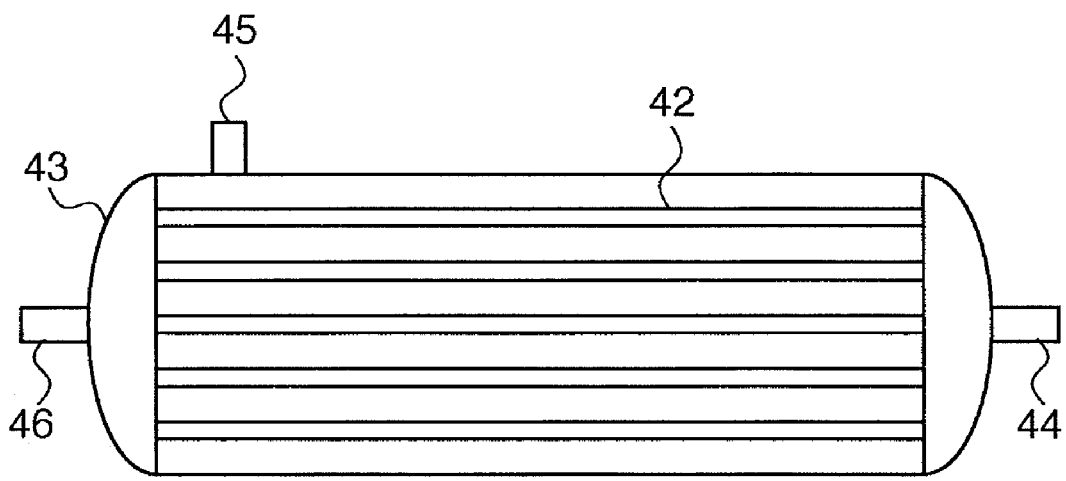
FIG. 5 shows the structure of a degassing unit of an immersion liquid supply system.

FIG. 1 shows the structure of an immersion liquid supply system of a liquid immersion exposure apparatus in the first embodiment of the present invention, and the same reference numerals used in FIG. 1 denote parts common to those in FIG. 4.

The immersion liquid supplied from the factory equipment passes through a supply line 28 and is supplied to a front side degassing unit 1. The temperature and flow rate of the immersion liquid are to be adjusted, and thus, it is desirable to set the front side degassing unit 1 downstream of a temperature adjustment 2 and a flow rate control unit 3. According to the structure, the fluctuation in degassing caused by the change of the pressure and temperature of the supplied immersion liquid can be eliminated, and further stability in degassing performance can be attained.

The front side degassing unit 1 has a degassing module 5 of which tube-shaped hollow fiber membranes are bundled together and have a structure in which a space is separated into the membrane wall interior and the membrane wall exterior of the hollow fiber membrane, and a nitrogen gas supply system 4. In the degassing module 5, the immersion liquid is supplied from an interior supply port 6, which is communicated with the interior of the membrane wall (membrane interior), and nitrogen gas is supplied from an exterior supply port 7, which is communicated with the exterior of the membrane wall (membrane exterior).

By supplying nitrogen gas to a predetermined pressure value at the membrane wall exterior and decreasing the partial pressure of oxygen, it is possible to remove dissolved oxygen in the immersion liquid by diffusing and passing through the dissolved oxygen gas at the hollow fiber membrane and discharging the oxygen to the membrane wall exterior. Accordingly, it is desirable to provide a pressure reducing valve 10 and a barometer 11 on the nitrogen gas supply system 4, and also to provide a flow metering valve 12 for adjusting a back-pressure on an exterior discharge port 9 communicated with the membrane wall exterior of the hollow fiber membrane.

The immersion liquid, from which dissolved oxygen is removed, is discharged from the interior discharge port 8 communicated with the membrane wall interior, and is supplied to a rear side degassing unit 13.

The immersion liquid, which has passed through the front side degassing unit 1, contains dissolved gases consisting primarily of nitrogen gas. Thus, the dissolved gases evaporate and micro-bubbles are generated, if supplied as is to the liquid immersion exposure apparatus. This causes deterioration of imaging performance. For this reason, the rear side degassing unit 13 is provided downstream of the front side degassing unit 1 for degassing by vacuum.

The rear side degassing unit 1 has a degassing module 43 of which tube-shaped hollow fiber membranes are bundled together and have a structure in which a space is separated into the membrane wall interior and the membrane wall exterior of the hollow fiber membrane, and a vacuum pressure supply system 14. The immersion liquid is supplied from an interior supply port 44 communicated with the membrane wall interior of the degassing module 43, and vacuuming is performed from an exterior supply port 45 communicated with the membrane wall exterior.

By setting a vacuum pressure of the membrane wall exterior to a predetermined pressures value, and decreasing the partial pressure of the gas, the dissolved gas in the immersion liquid is removed by diffusing and passing through the dissolved gas at the hollow fiber membrane, and discharging the gas to the membrane wall exterior. Accordingly, it is desirable to provide a vacuum pressure reducing valve 15 and a vacuum barometer 16 on the vacuum pressure supply system 14. As shown in FIG. 4, the immersion liquid, from which dissolved gases have been removed by passing through the rear side degassing unit 13, passes through the supply line 28 and is temperature-adjusted by a heater 25, a temperature sensor 26 and a temperature adjusting device 27, which is then supplied to the liquid immersion region from the liquid supply nozzle 22.

According to the present embodiment, even if fluctuations in the amount of dissolved gases contained in the factory equipment-supplied immersion liquid and the atmospheric pressure, the partial pressure oxygen can be regulated within a predetermined value using the nitrogen gas supply pressure adjustment of the front side degassing unit 1. Further, the amount of dissolved oxygen in the immersion liquid can be suppressed within a predetermined amount by passing the immersion liquid through the degassing module. As a result, changes in the refractive index within the liquid immersion region caused by fluctuation in the concentration of dissolved oxygen can be suppressed.

Further, by performing vacuum degassing at the rear side degassing unit 13 and removing dissolved gases from the liquid immersion fluid, deterioration of imaging performance due to micro-bubbles can be suppressed.

Second Embodiment

Figure 2:
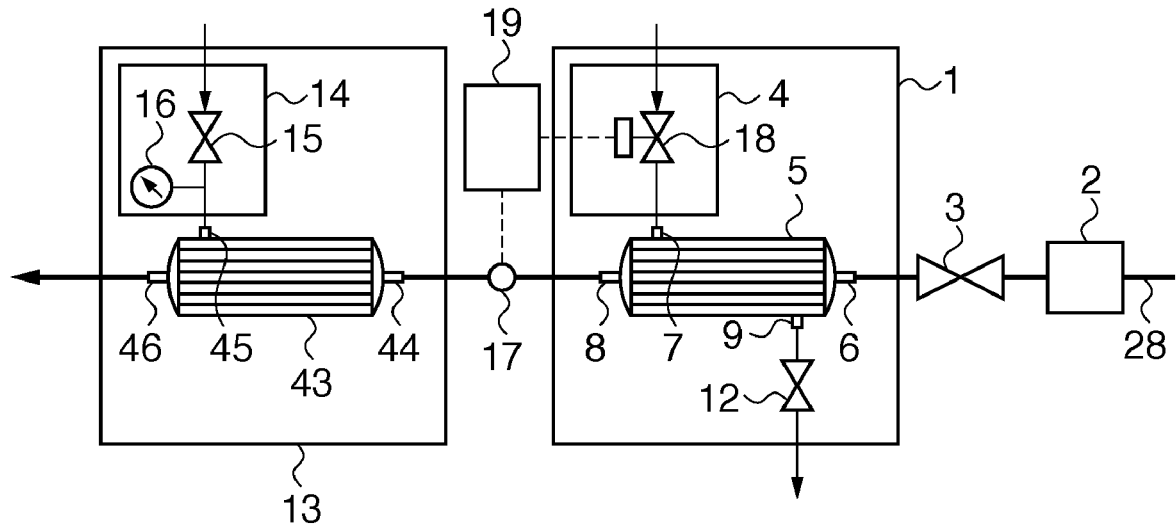
FIG. 2 shows the structure of a degassing unit of an immersion liquid supply system in a second embodiment of the present invention.

FIG. 2 shows the structure of a degassing unit of a liquid immersion exposure apparatus in a second embodiment of the present invention, and the same reference numerals as those in FIG. 2 denote parts common to the aforementioned first embodiment.

The present embodiment provides, between the front side degassing unit 1 and the rear side degassing unit 13 (in other words, downstream of the front side degassing unit 1 and upstream of the rear side degassing unit 13) a dissolved oxygen measurement sensor 17, which detects the amount of dissolved oxygen in the liquid immersion fluid.

Further, a nitrogen gas supply pressure control valve 18, which controls pressure by the amount of supplied nitrogen gas, is provided, and a dissolved oxygen control 19, which controls the nitrogen gas supply pressure control valve 18, such that the amount of dissolved oxygen detected by the dissolved oxygen measurement sensor 17 is constantly at a predetermined value, is provided.

Figure 3:
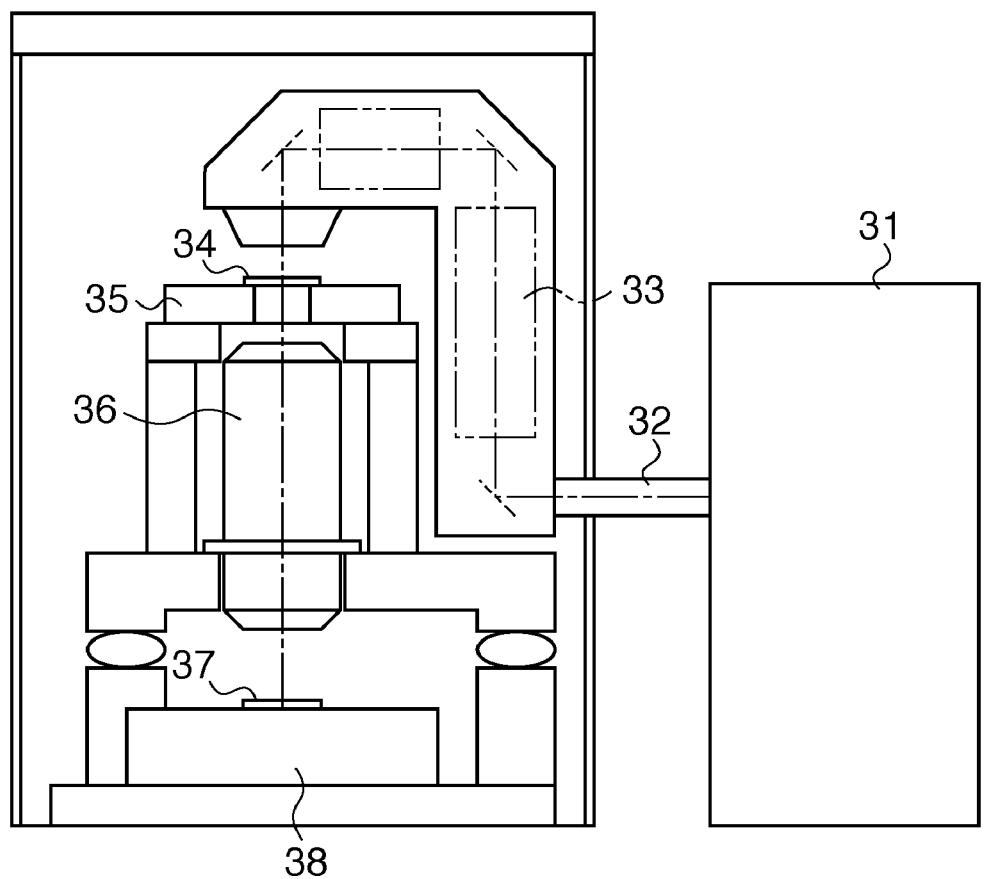
FIG. 3 shows the structure of an exposure apparatus.

The immersion liquid supply system mentioned in each of the embodiments is, for example, mounted in an exposure apparatus shown in FIG. 3, and the pattern of a reticle 34, as the original, is exposed onto a wafer 47, as the substrate, via a projection optical system 36, and under a state in which the gap between the projection optical system 36 and the wafer 37 is filled with immersion liquid.

Subsequently, the reticle 34 and the wafer 37 are each driven by a reticle stage 35 and a wafer stage 38, respectively, and are repeatedly exposed by step-and-repeat, or exposed while scanning the reticle stage 35 and the wafer stage 38, which are synchronized.

According to the present embodiment, since the amount of dissolved oxygen in the immersion liquid can be directly regulated, highly accurate regulation of the amount of dissolved oxygen can be performed. As a result, fluctuation in transmittance and refractive index caused by fluctuations in the amount of dissolved oxygen can be prevented, leading to attainment of highly stable optical performance in the exposure apparatus. Further, if, for some reason, the amount of dissolved oxygen surpasses a predetermined amount, it is possible to prevent trouble from happening by outputting a warning.

As discussed above, the degassing unit for immersion liquid supplied from the factory equipment is given at least two degassing steps, where the first step performs degassing with nitrogen gas, which removes dissolved oxygen, such that its amount falls below a predetermined value, and the second step performs degassing with a vacuum, which removes dissolved gases consisting primarily of nitrogen gas. With this arrangement, it is possible to reduce the partial pressure of oxygen, which is difficult to reduce with a vacuum, but is easily attainable by degassing with nitrogen gas. Thus, an immersion liquid, in which dissolved oxygen content is minimized to an infinitesimal amount, can be generated. Further, the concentration of dissolved oxygen due to fluctuations in the degassing performance of the vacuum pump due to changes in the atmospheric pressure of the vacuum pump occurring in the vacuum degassing, can be completely eliminated.

Further, by performing the second step of vacuum degassing, which removes dissolved gases (primarily nitrogen), occurrence of micro-bubbles can be prevented.

As a result, it is possible to minimize fluctuations in the amount of dissolved oxygen by suppressing changes in the degassing performance caused by changes in temperature and pressure of the immersion liquid supplied from the factory equipment and changes in the atmospheric pressure. Further, it suppresses changes in transmittance and refractive index of the liquid immersion fluid, correlated with the amount of dissolved oxygen content, and also suppresses occurrence of micro-bubbles, so that a liquid exposure apparatus with excellent optical performance can be attained.

[Device Manufacturing Method]

Next, the method of manufacturing semiconductor devices using the exposure device of the present embodiments will be explained.

The device (semiconductor integrated circuit elements liquid display element, etc.) is manufactured via an exposure process exposing the substrate using the exposure device of the above-mentioned embodiment, a development process which develops the exposed substrate during the exposure process, and other well-known processes which process the developed substrate during the development process.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus which exposes a pattern of an original onto a substrate via a projection optical system in a state in which a gap between the projection optical system and the substrate is filled with a liquid, the exposure apparatus comprising:
    a liquid supply unit which supplies a liquid to the gap;
    a front side degassing unit provided so as to perform a degassing, using nitrogen gas, to the liquid prior to the liquid being supplied to the gap;
    a dissolved gas measurement unit provided on a downstream side of said front side degassing unit; and
    a rear side degassing unit provided on a downstream side of said dissolved gas measurement unit, said rear side degassing unit removing dissolved gases by vacuuming,
    wherein said front side degassing unit has a dissolved oxygen control unit which controls a supply amount of nitrogen gas so as to maintain the amount of dissolved oxygen, measured by said dissolved gas measurement unit, at a predetermined value.

2. The apparatus according to claim 1, further comprising at least one flow rate adjustment unit which adjusts a flow rate of the liquid and is provided on an upstream side of said front side degassing unit.

3. The apparatus according to claim 2, further comprising at least one temperature adjustment unit which adjusts a temperature of the liquid and is provided on an upstream side of said at least one flow rate adjustment unit.

4. A device manufacturing method using an exposure apparatus according to claim 1, the method comprising:
    a step of exposing a pattern of an original onto a substrate; and
    a step of developing the substrate which is exposed in said exposing step.

* * * * *